United States Patent
Schirmann et al.

(10) Patent No.: US 10,725,214 B2
(45) Date of Patent: Jul. 28, 2020

(54) DIAMOND BROAD BAND MIRROR SYSTEM AND METHOD

(71) Applicants: Ernest Schirmann, Lake Zurich, IL (US); Priya Raman, Winfield, IL (US); Adam Khan, San Francisco, CA (US); Robert Polak, Lindenhurst, IL (US)

(72) Inventors: Ernest Schirmann, Lake Zurich, IL (US); Priya Raman, Winfield, IL (US); Adam Khan, San Francisco, CA (US); Robert Polak, Lindenhurst, IL (US)

(73) Assignee: AKHAN Semiconductor, Inc., Gurnee, IL (US)

(*) Notice: Subject to any disclaimer, the term of this patent is extended or adjusted under 35 U.S.C. 154(b) by 0 days.

(21) Appl. No.: 15/891,419

(22) Filed: Feb. 8, 2018

(65) Prior Publication Data

US 2019/0064404 A1 Feb. 28, 2019

Related U.S. Application Data

(60) Provisional application No. 62/456,276, filed on Feb. 8, 2017.

(51) Int. Cl.
*G02B 5/08* (2006.01)
*G21K 1/06* (2006.01)
*G02B 1/14* (2015.01)

(52) U.S. Cl.
CPC .............. *G02B 5/0891* (2013.01); *G02B 1/14* (2015.01); *G02B 5/0858* (2013.01); *G21K 1/062* (2013.01)

(58) Field of Classification Search
CPC ... G02B 1/00; G02B 1/02; G02B 1/10; G02B 1/105; G02B 1/14; G02B 5/08; G02B 5/0808; G02B 5/0816; G02B 5/085; G02B 5/0858; G02B 5/0875; G02B 5/0891; G21K 1/062
USPC ........ 359/350, 359, 360, 838, 839, 871, 883, 359/884; 427/162, 163.1, 164
See application file for complete search history.

(56) References Cited

U.S. PATENT DOCUMENTS

| | | | | |
|---|---|---|---|---|
| 5,272,104 A | * | 12/1993 | Schrantz | H01L 21/76224 148/DIG. 12 |
| 6,783,253 B2 | * | 8/2004 | Thomsen | C03C 17/36 359/870 |
| 2002/0051286 A1 | * | 5/2002 | Blitstein | G02B 5/0808 359/350 |
| 2015/0140740 A1 | * | 5/2015 | Moldovan | C25D 1/04 438/122 |
| 2015/0153485 A1 | * | 6/2015 | Monty | G02B 5/0808 433/31 |
| 2016/0333472 A1 | * | 11/2016 | Xu | C23C 16/01 |
| 2018/0224586 A1 | * | 8/2018 | Weigl | G02B 5/0858 |

* cited by examiner

*Primary Examiner* — Arnel C Lavarias
(74) *Attorney, Agent, or Firm* — The Thompson Law Office, P.C.; Lawrence E. Thompson

(57) ABSTRACT

A broad band mirror system and method, wherein the system includes a mechanical substrate layer, a reflective metal layer on the mechanical substrate level, and a diamond layer, and the method includes the steps of selecting a sacrificial substrate layer, depositing a diamond layer on the substrate layer, smoothing a first surface of the diamond layer, depositing a reflective metal layer on the diamond layer, bonding a mechanical substrate to the diamond layer, removing the sacrificial substrate level, and smoothing a second diamond surface.

7 Claims, 1 Drawing Sheet

DIAMOND BROAD BAND MIRROR SYSTEM AND METHOD

CROSS-REFERENCE TO RELATED APPLICATION

This application claims the benefit of U.S. Provisional Application No. 62/456,276, filed Feb. 8, 2017, which is fully incorporated herein by reference.

BACKGROUND

Field

This invention is generally related to broad band mirrors, and more particularly to a broad band mirror system and method having at least one reflective metal layer and at least one diamond layer.

Background

Broad band mirrors are used in a number of applications, including those related to space telescopy. Prior art broad band mirror systems and methods do not include a practical method and system for a broad band mirror having reflective metal and diamond layers.

SUMMARY

Disclosed herein is a new and improved system and method for broad band mirrors. In accordance with one aspect of the approach, a broad band mirror system may include a mechanical substrate layer, a reflective metal layer on the mechanical substrate level, and a diamond layer on the reflective metal layer.

In another approach, a method of fabricating a broad band mirror may include the steps of selecting a sacrificial substrate layer, depositing a diamond layer on the substrate layer, smoothing a surface of the diamond layer, depositing a reflective metal layer on the diamond layer, bonding a mechanical substrate to the diamond layer, removing the sacrificial substrate level, and smoothing the diamond surface.

Other systems, methods, aspects, features, embodiments and advantages of the system and method disclosed herein will be, or will become, apparent to one having ordinary skill in the an upon examination of the following drawings and detailed description. It is intended that all such additional systems, methods, aspects, features, embodiments and advantages be included within this description, and be within the scope of the accompanying claims.

BRIEF DESCRIPTION OF THE DRAWINGS

It is to be understood that the drawings are solely for purpose of illustration. Further more, the components in the figures are not necessarily to scale, emphasis instead being placed upon illustrating the principles of the system disclosed herein. In the figures, like reference numerals designate corresponding parts throughout the different views.

DETAILED DESCRIPTION

The following detailed description, which references to and incorporates the drawings, describes and illustrates one or more specific embodiments. These embodiments, offered not to limit but only to exemplify and leach, are shown and described in sufficient detail to enable those skilled in the art to practice what is claimed. Thus, for the sake of brevity, the description may omit certain information known to those of skill in the art.

High reflectivity mirrors are critical for broad spectrum space telescopy. Mirror structures generally require reflective or protective coatings to enhance sensitivity, spectral bandwidth, throughput, or reliability of space-born telescope systems. Mirror structures that include reflective metal and diamond layers may extend the usable reflective wavelength range. Such reflective metal and diamond mirror systems may also resolve prior art limitations related to thermal management, surface roughness, and contamination associated with the fabrication of prior art systems. Such reflective metal and diamond mirror systems may find applications in regard to space exploration.

Wavelength ranges of particular interest for near and mid-term space exploration include ultraviolet (UV, approximately 10-400 nm), visible (approximately 400-700 nm), and near infrared (near IR, approximately 700-2500 nm). Pure Aluminum (Al) is an excellent reflective metal over most of this range. However, without protection, Aluminum may be limited to a minimum wavelength of approximately 200 nm due to oxidation. Protective, transmissive coatings such as $MgF_2$, $AlF_3$, or LiF can extend the useful range of Al but are ineffective at wavelengths below approximately 100 nm due to absorption and/or environmental degradation over time. Shorter (10-122 nm) wavelengths including extreme UV (EUV) and Lyman UV (LUV), are particularly important for solar and exoplanet observations, respectively, but are not fully accessible with fluoride based protective coatings. Other reflective metals include, but are not limited to, Titanium, Gold, Silver, Copper, Chromium, and Steel.

Silicon Carbide (SiC) is a prior art reflective UV coating for mirrors. Diamond reflectivity over 10-110 nm (most of the EUV-LUV spectrum) may be superior to SiC and over 70-110 nm, exceeds 45% for normal incidence angles (<10%). Diamond also has high transmissivity over visible wavelengths, making it an attractive protective coating for highly reflective Al in that range. Other superior diamond properties include extremely high mechanical hardness, high thermal conductivity, low coefficient of thermal expansion, and inherent radiation hardness, chemical inertness, and hydrophobicity. Diamond, while acting as a protective coating for a reflective metal, may have a hardness greater than 55 GPa (GigaPascals) and may also have a Young's Modulus over 200 GPa.

Figure 1:
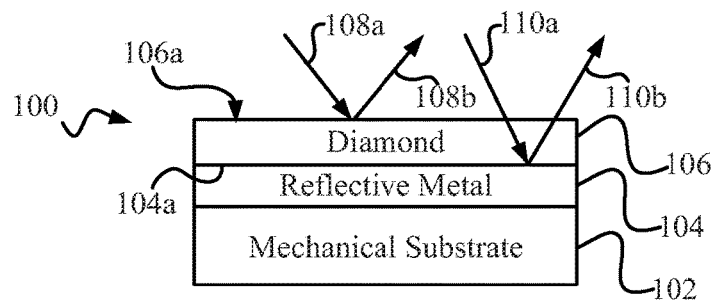
FIG. 1 is an exemplary broad band mirror structure.

FIG. 1 shows an exemplary broad band mirror 100 including a mechanical substrate 102, a reflective metal layer 104 and a diamond layer 106. Incident ray 108a is an exemplary UV incident wave shown reflecting from the diamond surface 106a. Reflection ray 108b is a UV reflective wave associated with incident ray 108a. Incident ray 110a is an exemplary visible spectrum incident wave shown reflecting from the reflective metal at the diamond/metal interface 104a. Reflection ray 110b is a visible spectrum reflective wave associated with incident ray 110a. Mechanical substrate 102 serves primarily to provide strength and structure for the reflective metal layer 104 and the diamond layer 106.

Broad band mirror 100 may extend the wavelength spectrum coverage for a single mirror structure. In broad band mirror 100, the diamond layer 106 may serve as both the dominant reflector for UV wavelengths, and as a protective transmissive layer at visible wavelengths where a reflective metal is the dominant reflector. Wavelength coverage can also be extended to include near IR by replacing the diamond layer with a multilayer thin film structure that includes diamond.

Diamond/metal mirror structures had been considered impractical due to problems associated with the prior an manufacturing processes. For example, die following issues were presumed to make the use of the structure shown in FIG. 1, impractical or impossible. First, historically, diamond thin layers generally required deposition temperatures in excess of 4000 degrees C. However, the maximum temperature that can generally be tolerated by space mirror assemblies is significantly lower than 3000 C. These reduced temperatures are necessary to preserve the integrity of bonding materials and to avoid structural deformation, such as warping, of the assemblies. Second, the seeding process that precedes diamond synthesis generally scars the surface of the substrate material, such as Aluminum substrate. Such scarring degrades the reflective properties of the substrate. Finally, a pure metal surface is subject to oxidation or other contamination even with short duration exposure to an Oxygen or moisture containing environment. To avoid metal oxidation or other contamination, with prior art technology, an elaborate dosed system might be required to transfer a reflective metal mirror substrate from, for example, a Physical Vapor Deposition (PVD, sputter or evaporation) to a diamond deposition tool in an inert gas environment.

Figure 2:
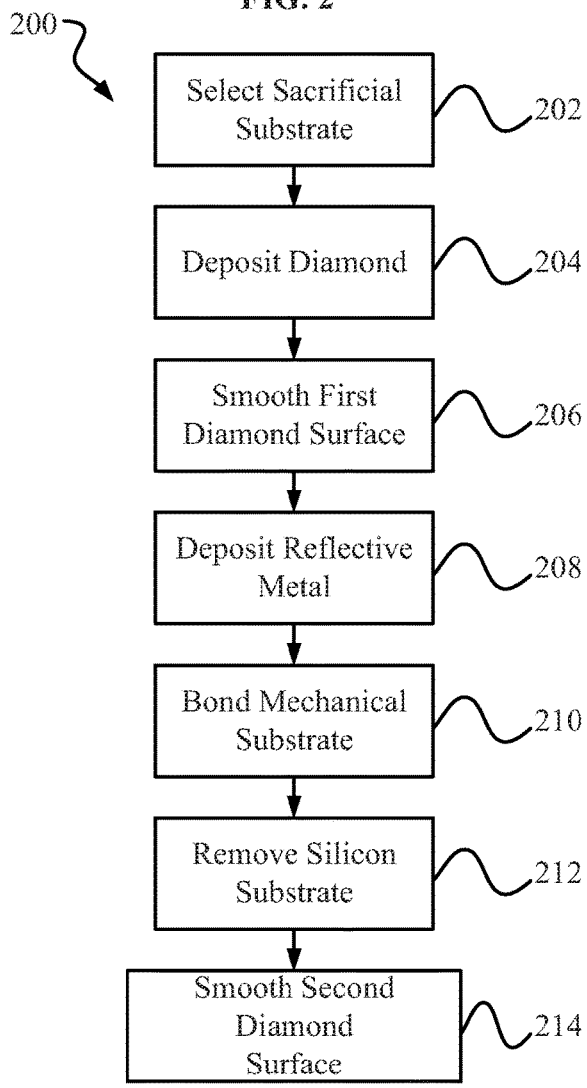
FIG. 2 is an exemplary block diagram of an embodiment of a method for fabricating a broad band mirror, such as the broad band mirror structure of FIG. 1.

FIG. 2 shows an exemplary block diagram of an embodiment of a method 200 for fabricating a broad band mirror, such as, but not limited to, the broad band mirror. Method 200 may overcome many of the prior art fabrication issues, in part, by allowing a process reversal. In method 200, the reflective metal layer, for example reflective metal layer 104, may be deposited on diamond, for example diamond layer 106. Method 200 may include a step 202 of selecting a sacrificial substrate. The sacrificial substrate may provide mechanical support for subsequent intermediate steps. The sacrificial substrate may also provide a surface for diamond synthesis. The sacrificial substrate may be Silicon. In other embodiments, the sacrificial substrate may be, for example, but not limited to, SiC, Sapphire, fused silica, etc.

Method 200 may include a diamond deposition step 204. For example, step 204 may include depositing diamond layer 106, on the sacrificial substrate. Step 204 may include a wet or dry chemical cleaning and may include seeding, or alternative processes for promoting diamond nucleation on the sacrificial substrate. Step 204 may include, for example, Hot Filament Chemical Vapor Imposition (HFCVD) and/or Microwave Plasma Chemical Vapor Deposition (MWCVD) techniques. Step 204 may include, for example, poly-crystalline (PCD) or single-crystalline (SCD) types of diamond Step 204 may include a diamond deposition with sufficient thickness, for example 10 nm to 100 nm, to protect the subsequent reflective metal layer from oxidation or other contamination. Step 204 may include diamond deposition with thickness adjusted to maximize reflectivity at specific wavelengths through constructive interference.

Method 200 may include a step 206 of smoothing a first diamond surface. In step 206, the diamond layer, for example diamond layer 106, may be smoothed or polished to reduce surface roughness, thereby reducing undesirable diffuse (scattering) reflection. A Root Mean Square (RMS) surface roughness that is less than 10% of the minimum incident light wavelength may be required to ensure high specular (ideal) reflection. Step 206 may include, for example, but not limited to, Reactive Ion Etching (RIE), Chemical Mechanical Polishing (CMP), and a combination of RIE and CMP.

Method 200 may include a reflective metal deposition step 208. For example, step 208 may include depositing reflective metal layer 104, on diamond layer 106. Step 208 may include a wet or dry chemical cleaning or treatment to promote reflective metal adhesion. In step 208, the reflective metal layer may be Aluminum. In other embodiments, the reflective metal layer may be, for example, but not limited to, Ti, Steel, gold, silver, copper, and chromium. In step 208, the reflective metal may be deposited on the smoothed diamond surface using, for example, but not limited to, thermal and electron-beam evaporation and PVD techniques. Step 208 may include creating sufficient reflective metal thickness, for example but not limited to 60 urn or greater, to avoid damage in subsequent processing steps and to maintain a reflective diamond-metal interface.

Method 200 may include a step 210 of bonding a mechanical substrate. In step 5, a thick substrate, for example, but not limited to, Aluminum, Beryllium, Ultra Low Expansion (ULE) glass, may be bonded to the reflective metal layer of step 208 to enhance mechanical strength. Adhesion may be achieved via bonding compounds, such as, but not limited to epoxies, and other substrate dependent techniques.

Figure 3:
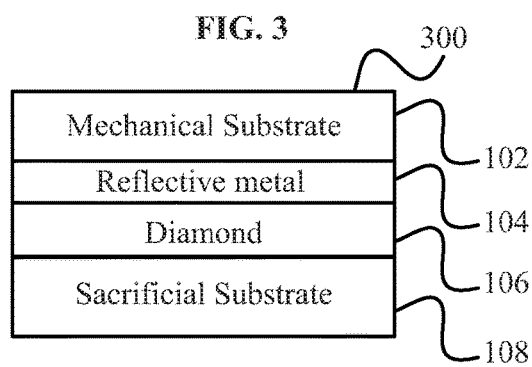
FIG. 3 is an exemplary illustration of an intermediate product of the method of FIG. 2.

FIG. 3 shows an intermediate broad band mirror system 300 to provide an exemplary illustration of a system 300 after steps 202-210. Intermediate broad band mirror system 300 includes a sacrificial substrate 108, such as may be selected in step 202. System 300 includes a diamond layer 106, such as the diamond layer that may be fabricated in steps 204 and 206. System 300 includes a reflective metal layer 104, such as the reflective metal layer that may be fabricated in step 208. And, system 300 includes a mechanical substrate level 102, such as the mechanical substrate that may be fabricated in step 210.

Method 200 may further include a step 212 of removing the sacrificial substrate. For example, step 212 may include removing sacrificial substrate 108. Step 212 may include using a wet and dry etching process. Method 200 may also include a step 214 of smoothing a second diamond surface to reduce surface roughness and diffuse (scattering) reflections as in step 206. For example, step 214 may include smoothing and polishing diamond surface 106a, for example, using RIA, CMP, or a combination thereof.

In other embodiments, the diamond layer 106 may be a diamond-based multilayer film. A diamond-based multilayer film may extend the reflective wavelength range. A diamond-based multilayer film may also enhance reflectivity over a specific wavelength range. For example, the diamond-based multilayer film could incorporate indium Tin Oxide (ITO) which has high reflectivity at IR wavelengths and high transmissivity in the visible range. In one embodiment, depositing a diamond layer step 204 may include depositing a multilayer structure including diamond to extend the reflective wavelength range or to enhance reflectivity over a specific wavelength range.

The broad band mirror system 100, and method 200, may incorporate systems and methods previously disclosed and described in U.S. Patent Publication No. 2013/0026492, by Adam Khan, published on Jan. 31, 2013; U.S. Pat. No. 8,354,290, issued to Anirudha Sumant, et al. on Jan. 15, 2013; U.S. Pat. No. 8,933,462, issued to Adam Khan on Jan.

13, 2015; U.S. Patent Publication No. 2015/0206749, by Adam Khan, published on Jul. 23, 2015; and U.S. Patent Publication No. 2015/0295134, by Adam Khan, et al, published on Oct. 15, 2015, all of which are fully incorporated herein by reference.

This disclosure provides several preferred embodiments of fabrication, however, the performance characteristics and materials characteristics described in this application are not necessarily performance bounds or limitations of the invention. These disclosures merely demonstrate some aspects of the invention that have presently been tested.

The word "exemplary" is used herein to mean "serving as an example, instance, or illustration." Any embodiment or variant described herein as "exemplary" is not necessarily to be construed as preferred or advantageous over other embodiments or variants. All of the embodiments and variants described in this description are exemplary embodiments and variants provided to enable persons skilled in the art to make and use the invention, and not necessarily to limit the scope of legal protection afforded the appended claims.

The above description of the disclosed embodiments is provided to enable any person skilled in the art to make or use that which is defined by the appended claims. The following claims are not intended to be limited to the disclosed embodiments. Other embodiments and modifications will readily occur to those of ordinary skill in the art in view of these teachings. Therefore, the following claims are intended to cover all such embodiments and modifications when viewed in conjunction with the above specification and accompanying drawings.

We claim:

1. A broad band mirror system, comprising:
   a mechanical substrate layer,
   a reflective metal layer on the mechanical substrate layer,
   at least one layer of Indium Tin Oxide; and
   a diamond layer on the reflective metal layer.

2. The broad hand mirror system of claim 1, wherein the diamond layer is between 10 and 100 nanometers.

3. The broad band mirror system of claim 1, wherein the reflective metal is deposited by electron bean evaporation or by sputtering physical vapor deposition.

4. The broad band mirror system of claim 1, wherein the reflective metal is one of a reflective metal group consisting of Aluminum, steel, Gold, Silver, Copper, Chromium, and Titanium.

5. The broad band mirror system of claim 1, wherein the reflective metal is a combination of reflective metals from a reflective metal group consisting of Aluminum, steel, Gold, Silver, Copper, Chromium, and Titanium.

6. The broad band mirror system of claim 1 wherein a reflectivity from the system is in excess of 45 percent at incidence angles of less than 10 degrees for ultraviolet wavelengths between 70 and 100 nanometers.

7. A method of fabricating a broad band mirror, including the steps of:
   selecting sacrificial substrate layer,
   depositing a diamond layer on the substrate layer,
   smoothing a surface of the diamond layer,
   depositing a reflective metal layer on the diamond layer,
   bonding a mechanical substrate to the diamond layer,
   removing the sacrificial substrate layer; and
   smoothing a second diamond surface after removal of the sacrificial substrate layer.

* * * * *